(12) United States Patent
Takanishi et al.

(10) Patent No.: US 8,686,528 B2
(45) Date of Patent: Apr. 1, 2014

(54) SEMICONDUCTOR DEVICE (75) Inventors: Yudai Takanishi, Osaka (JP); Masao Moriguchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 62 days.

(21) Appl. No.: 13/147,640

(22) PCT Filed: Jan. 29, 2010

(86) PCT No.: PCT/JP2010/000561
§ 371 (c)(1),
(2), (4) Date: Sep. 1, 2011

(87) PCT Pub. No.: WO2010/089981
PCT Pub. Date: Aug. 12, 2010

(65) Prior Publication Data
US 2011/0303916 A1 Dec. 15, 2011

(30) Foreign Application Priority Data

Feb. 4, 2009 (JP) ................................ 2009-023776

(51) Int. Cl.
*H01L 27/146* (2006.01)
(52) U.S. Cl.
USPC ............ 257/448; 257/E29.291; 257/E29.294; 257/E21.414; 257/E27.112; 257/E29.116; 257/E29.117; 257/E29.145; 257/E29.147; 257/E29.12; 257/E29.122; 257/E29.299; 438/159
(58) Field of Classification Search
USPC ........... 257/448, E29.291, E29.294, E29.116, 257/E29.117, E29.145, E29.147, E29.12, 257/E29.122, E29.299, E21.414, E27.112; 438/159; 349/43
See application file for complete search history.

(56) References Cited

U.S. PATENT DOCUMENTS

| 6,573,564 | B2 * | 6/2003 | Yamazaki et al. | 257/353 |
| 2001/0046001 | A1 * | 11/2001 | Yamaguchi et al. | 349/43 |
| 2003/0112383 | A1 * | 6/2003 | Kim | 349/43 |
| 2005/0173734 | A1 | 8/2005 | Yoshioka et al. | |
| 2006/0017681 | A1 * | 1/2006 | Jang et al. | 345/98 |

(Continued)

FOREIGN PATENT DOCUMENTS

| JP | 02-203568 A | 8/1990 |
| JP | 02-237039 A | 9/1990 |

(Continued)

OTHER PUBLICATIONS

Official Communication issued in International Patent Application No. PCT/JP2010/000561, mailed on Mar. 16, 2010.

(Continued)

*Primary Examiner* — Kimberly Rizkallah
*Assistant Examiner* — Maria Ligai
(74) *Attorney, Agent, or Firm* — Keating & Bennett, LLP (57) ABSTRACT

A semiconductor device of the present invention includes: a lower electrode (110); a contact layer (130) including a first contact layer (132), a second contact layer (134) and a third contact layer (136) overlapping with a semiconductor layer (120); and an upper electrode (140) including a first upper electrode (142), a second upper electrode (144) and a third upper electrode (146). The second contact layer (134) includes a first region (134*a*), and a second region (134*b*) separate from the first region (134*a*), and the second upper electrode (144) is directly in contact with the semiconductor layer (120) in a region between the first region (134*a*) and the second region (134*b*) of the second contact layer (134).

16 Claims, 9 Drawing Sheets

(56) References Cited

U.S. PATENT DOCUMENTS

2006/0244107 A1 11/2006 Sugihara et al.
2007/0072439 A1* 3/2007 Akimoto et al. .............. 438/795
2007/0257260 A1 11/2007 Liu

FOREIGN PATENT DOCUMENTS

| JP | 05-119347 A | 5/1993 |
|---|---|---|
| JP | 11-097701 A | 4/1999 |
| JP | 2003-124473 A | 4/2003 |
| JP | 2003-218357 A | 7/2003 |
| JP | 2005-033172 A | 2/2005 |
| JP | 2005-038895 A | 2/2005 |
| JP | 2007-300060 A | 11/2007 |
| WO | 03/098699 A1 | 11/2003 |

OTHER PUBLICATIONS

English translation of Official Communication issued in corresponding International Application PCT/JP2010/00561, mailed on Sep. 22, 2011.

* cited by examiner

SEMICONDUCTOR DEVICE

TECHNICAL FIELD

The present invention relates to a semiconductor device.

BACKGROUND ART

A semiconductor device having thin film transistors (TFTs) is suitably used in an active matrix substrate of a display device. TFTs are classified into two types including those of a staggered structure (top-gate structure) and those of an inverse-staggered structure (bottom-gate structure). A polycrystalline silicon with which a high carrier mobility can be realized is mainly used in a semiconductor layer of a TFT of a staggered structure, whereas an amorphous silicon which can be easily formed through fewer steps is mainly used in a semiconductor layer of a TFT of an inverse-staggered structure.

In the display region of an active matrix substrate, pixel TFTs are provided as switching elements for pixels, and the OFF current of a pixel TFT is preferably small. In recent years, researches have been made for the provision of driver circuits, such as a gate driver for supplying scanning signals to gate bus lines and a source driver for supplying display signals to source bus lines, in the peripheral region which is provided in the periphery of the display region. In this case, the active matrix substrate includes not only the pixel TFTs provided in the display region, but also circuit TFTs provided in the driver circuit. The ON current of a circuit TFT is preferably high, and the circuit TFT is therefore designed so that the channel width thereof is large. However, if a high current flows through the channel region, heat may be generated in the semiconductor layer, thereby deteriorating the characteristics of the TFT or breaking the TFT. Therefore, researches have been made for TFTs with the aim of preventing the deterioration of characteristics due to heat (see, for example, Patent Documents 1 and 2).

Figure 9:
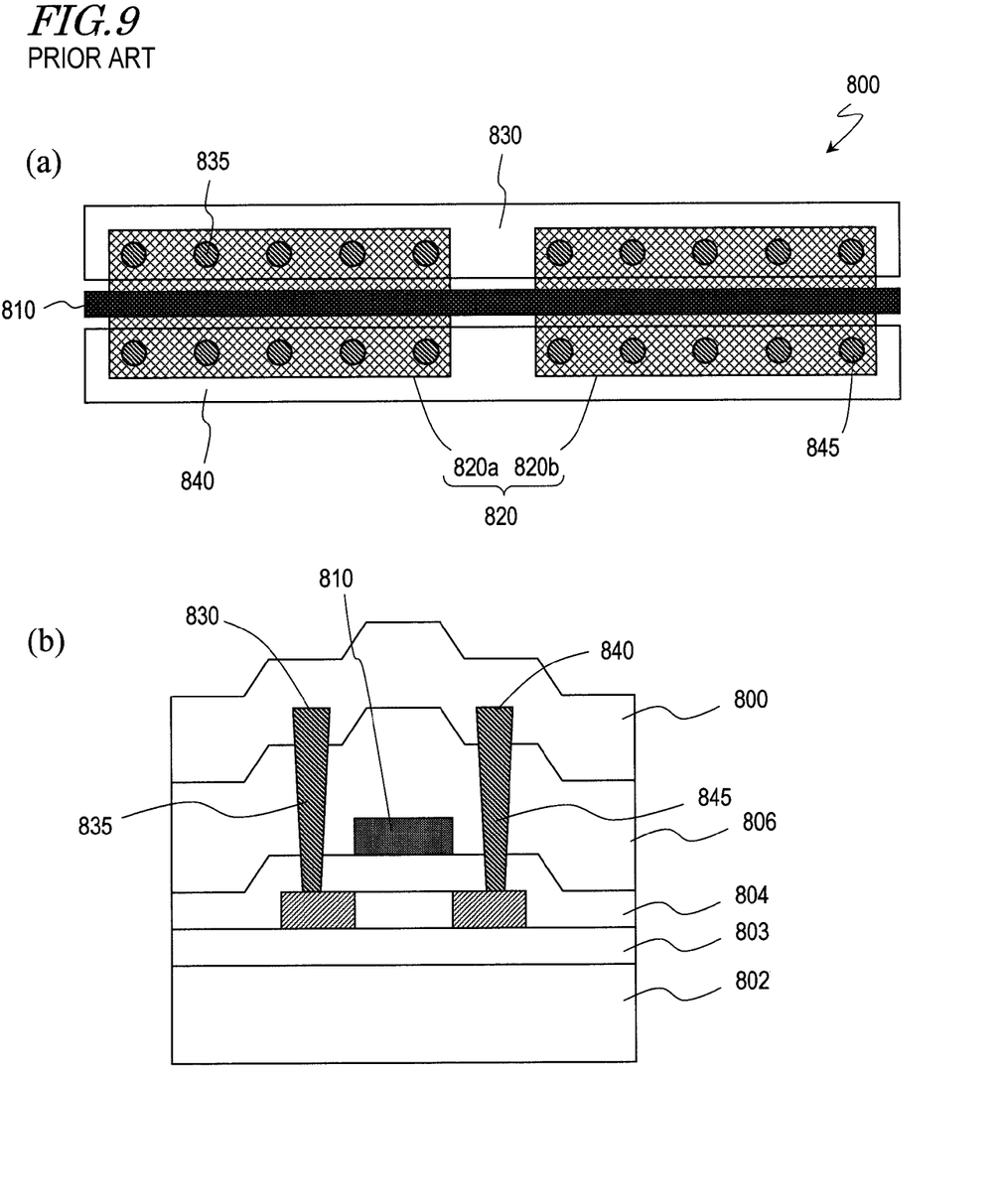

A TFT disclosed in Patent Document 1 will now be described with reference to FIG. 9. FIG. 9(a) shows a top view of a TFT 800 disclosed in Patent Document 1, and FIG. 9(b) shows a cross-sectional view of the TFT 800.

The TFT 800 includes a gate electrode 810, a semiconductor layer 820, a source electrode 830, and a drain electrode 840. As can be seen from FIG. 9, the gate electrode 810 extends in parallel to the source electrode 830 and the drain electrode 840. The semiconductor layer 820 includes a semiconductor region 820a, and a semiconductor region 820b provided separately from the semiconductor region 820a. Note that in the TFT 800, a region of the semiconductor layer 820 that overlaps with the gate electrode 810 serves as the channel region. Heat generated in the semiconductor layer 820 is not only transmitted to the source electrode 830 and the drain electrode 840 via contact holes 835 and 845 but can also be transmitted to the outside from the boundary between the semiconductor region 820a and the semiconductor region 820b, thus suppressing the deterioration of characteristics due to heat.

Figure 10:
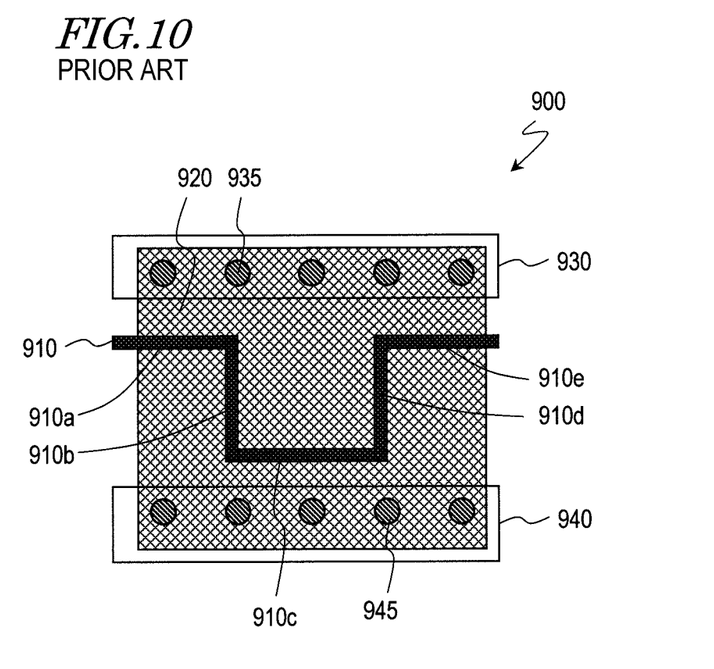
FIG. 10 A schematic top view showing another conventional thin film transistor.

A TFT disclosed in Patent Document 2 will be described with reference to FIG. 10. FIG. 10 shows a top view of a TFT 900 disclosed in Patent Document 2.

The TFT 900 includes a gate electrode 910, a semiconductor layer 920, a source electrode 930, and a drain electrode 940. Also in the TFT 900, a region of the semiconductor layer 920 that overlaps with the gate electrode 910 serves as the channel region. As can be seen from FIG. 10, a portion of the gate electrode 910 extends in parallel to the source electrode 930 and the drain electrode 940, but the gate electrode 910 is bent in a direction perpendicular to the direction in which the source electrode 930 and the drain electrode 940 extend in the region where it overlaps with the semiconductor layer 920. Thus, in the TFT 900, the gate electrode 910 is bent, thereby increasing the channel width with respect to the size of the semiconductor layer. Moreover, with the bending of the gate electrode 910, the electric field is reduced at least in areas where components of the channel region of different directions intersect with each other, thereby suppressing the heat generation. Therefore, with the TFT 900, the deterioration of characteristics is suppressed while the channel width is maintained to be relatively large.

CITATION LIST

Patent Literature
Patent Document No. 1: 2003-124473
Patent Document No. 2: 2003-218357

SUMMARY OF INVENTION

Technical Problem

With the TFT 800 disclosed in Patent Document 1, the semiconductor layer 820 is divided into a plurality of semiconductor regions 820a and 820b. Therefore, in order to sufficiently suppress the deterioration of TFT characteristics due to heat while maintaining a predetermined channel width, it is necessary to increase the interval between the semiconductor regions, resulting in an increase in the size of the TFT 800. Alternatively, if the size of the TFT 800 is kept constant, the channel width of the TFT 800 is decreased due to the division of the semiconductor layer 820, and an intended current may not be obtained.

In the TFT 900 disclosed in Patent Document 2, the gate electrode 910 is bent, thereby increasing the heat dissipation area and improving the heat dissipation effect. With the TFT 900, however, it is necessary to increase the distance between the source electrode 930 and the drain electrode 940 in order to sufficiently improve the heat dissipation effect, resulting in an increase in the size of the transistor.

The TFTs 800 and 900 disclosed in Patent Documents 1 and 2 are both of the staggered structure, and in the TFTs 800 and 900, a portion of the heat generated in the semiconductor layers 820 and 920 is transmitted to the outside via the contact holes 835, 845, 935 and 945, the source electrodes 830 and 930 and the drain electrodes 840 and 940. However, since the size of the contact holes is typically relatively small, the deterioration of TFT characteristics due to heat cannot sufficiently be suppressed by the TFTs 800 and 900.

The present invention has been made in view of the problems described above, and an object thereof is to provide a semiconductor device with which the deterioration of characteristics due to heat is suppressed.

Solution to Problem

A semiconductor device of the present invention is a semiconductor device including: a lower electrode; an insulating layer covering the lower electrode; a semiconductor layer provided on the insulating layer; a contact layer including a first contact layer, a second contact layer and a third contact layer each having at least a portion thereof overlapping with the semiconductor layer; and an upper electrode including a first upper electrode at least a part of which overlaps with the first contact layer, a second upper electrode at least a part of which overlaps with the second contact layer, and a third upper electrode at least a part of which overlaps with the third contact layer, with the second upper electrode located between the first upper electrode and the third upper electrode, wherein: the second contact layer includes a first region, and a second region separate from the first region; and the second upper electrode is directly in contact with the semiconductor layer in a region between the first region and the second region of the second contact layer.

In an embodiment, the semiconductor layer includes a first semiconductor region, and a second semiconductor region separate from the first semiconductor region; and at least a portion of the second upper electrode is provided in a region between the first semiconductor region and the second semiconductor region.

In an embodiment, a portion of the first contact layer and a portion of the second contact layer overlap with the first semiconductor region, and another portion of the second contact layer and the third contact layer overlap with the second semiconductor region.

In an embodiment, a thermal conductivity of the second upper electrode is higher than a thermal conductivity of the contact layer.

In an embodiment, the semiconductor layer includes a microcrystalline silicon film or an amorphous silicon film.

In an embodiment, the contact layer includes a silicon layer into which an impurity element is introduced.

A semiconductor device of the present invention is a semiconductor device including: a lower electrode; an insulating layer covering the lower electrode; a semiconductor layer provided on the insulating layer; and an upper electrode including a first upper electrode, a second upper electrode and a third upper electrode each having at least a portion thereof overlapping with the semiconductor layer, with the second upper electrode located between the first upper electrode and the third upper electrode, wherein: the semiconductor layer includes a first semiconductor region, and a second semiconductor region separate from the first semiconductor region; and at least a portion of the second upper electrode is provided between the first semiconductor region and the second semiconductor region.

In an embodiment, the semiconductor layer includes a polycrystalline silicon film.

In an embodiment, the second upper electrode includes a first side region opposing the first upper electrode, a second side region opposing the third upper electrode, and a center region located between the first side region and the second side region; and the center region of the second upper electrode is directly in contact with the semiconductor layer.

In an embodiment, the second upper electrode is in contact with the insulating layer.

In an embodiment, the first upper electrode is directly connected to the third upper electrode.

In an embodiment, the first upper electrode and the third upper electrode are portions of one of a source line and a drain line; and the second upper electrode is a portion of the other one of the source line and the drain line.

In an embodiment, the first upper electrode is not directly connected to the third upper electrode.

In an embodiment, the first upper electrode is a portion of one of a source line and a drain line; the second upper electrode is an intermediate electrode; and the third upper electrode is a portion of the other one of the source line and the drain line.

Advantageous Effects of Invention

The semiconductor device of the present invention can suppress the deterioration of characteristics due to heat. Such a semiconductor device can be suitably used in an active matrix substrate included in a display device such as a liquid crystal display device.

BRIEF DESCRIPTION OF DRAWINGS

FIG. 1 (a) is a schematic top view showing a first embodiment of the semiconductor device according to the present invention, and (b) is a cross-sectional view taken along line 1b-1b' of (a).

FIG. 2 (a) is a schematic top view showing a semiconductor device of Reference Example, and (b) is a cross-sectional view taken along line 2b-2b' of (a).

FIG. 3 (a) is a schematic diagram showing the transmission of heat generated in a channel region in the semiconductor device of Reference Example, and (b) is a schematic diagram showing the transmission of heat generated in a channel region of the semiconductor device of the first embodiment.

FIG. 5 (a) is a schematic top view showing a second embodiment of the semiconductor device according to the present invention, and (b) is a cross-sectional view taken along line 5b-5b' of (a).

FIG. 6 (a) is a schematic top view showing a third embodiment of the semiconductor device according to the present invention, (b) is a cross-sectional view taken along line 6b-6b' of (a), and (c) is a cross-sectional view taken along line 6c-6c' of (a).

FIG. 7 (a) is a schematic top view showing a fourth embodiment of the semiconductor device according to the present invention, and (b) is a cross-sectional view taken along line 7b-7b' of (a).

FIG. 8 (a) is a schematic top view showing a fifth embodiment of the semiconductor device according to the present invention, and (b) is a cross-sectional view taken along line 8b-8b' of (a).

FIG. 9 (a) is a schematic top view showing a conventional thin film transistor, and (b) is a cross-sectional view of (a).

DESCRIPTION OF EMBODIMENTS

Embodiments of the semiconductor device according to the present invention will now be described with reference to the drawings. Note however that the present invention is not limited to the following embodiments.

Embodiment 1

Figure 1:
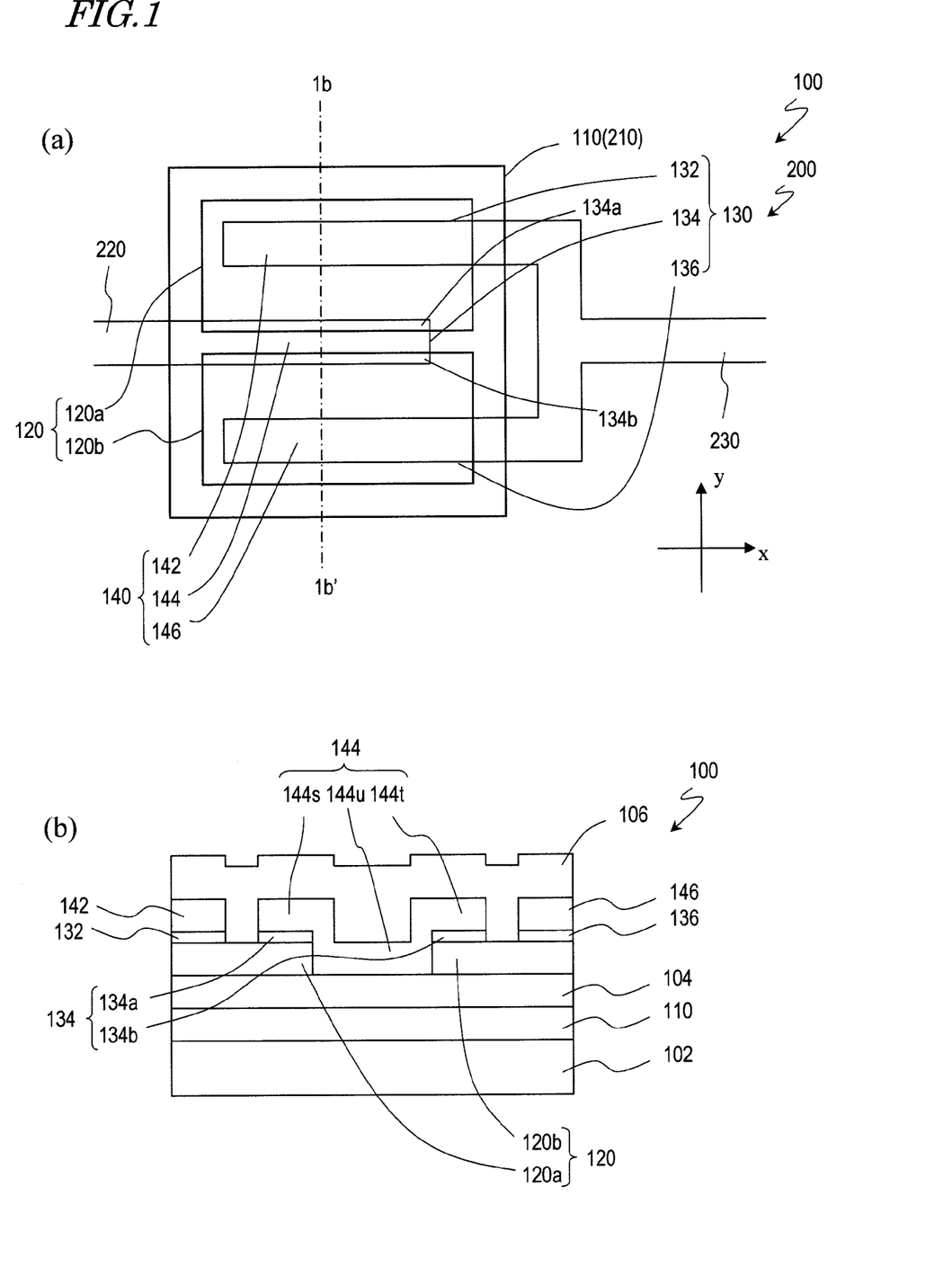

A first embodiment of the semiconductor device according to the present invention will now be described with reference to FIG. 1. FIG. 1(a) shows a schematic top view of a semiconductor device 100 of the present embodiment, and FIG. 1(b) shows a cross-sectional view taken along line 1b-1b' of FIG. 1(a).

The semiconductor device 100 includes a lower electrode 110 provided on an insulating substrate 102, an insulating layer 104 covering the lower electrode 110, a semiconductor layer 120 provided on the insulating layer 104, a contact layer 130, and an upper electrode 140. The lower electrode 110 is formed by a metal, for example, and specifically, the lower electrode 110 is formed by aluminum, tantalum, molybdenum or titanium. The insulating layer 104 is formed by an insulating material, and the insulating layer 104 is for example formed by a silicon oxide. The thickness of the lower electrode 110 is 1000 Å, for example.

The semiconductor layer 120 is formed by a silicon, for example, and specifically, the semiconductor layer 120 is formed by an amorphous silicon or a microcrystalline silicon. The thickness of the semiconductor layer 120 is 500 Å, for example. In the semiconductor device 100, the semiconductor layer 120 includes a semiconductor region 120a, and a semiconductor region 120b separate from the semiconductor region 120a. In the following description, the semiconductor region 120a and the semiconductor region 120b may be referred to as the "first semiconductor region 120a" and the "second semiconductor region 120b", respectively. The interval between the first semiconductor region 120a and the second semiconductor region 120b is 4 to 5 µm, for example.

The contact layer 130 is formed by a silicon with an impurity element added thereto, for example. The thickness of the contact layer 130 is 350 Å, for example. The contact layer 130 includes contact layers 132, 134 and 136 provided on the semiconductor layer 120. Specifically, the contact layer 132 is provided on the first semiconductor region 120a, and the contact layer 136 is provided on the second semiconductor region 120b. The contact layer 134 is provided on the first semiconductor region 120a and the second semiconductor region 120b. In the following description, the contact layer 132, the contact layer 134 and the contact layer 136 may be referred to as the "first contact layer 132", the "second contact layer 134", and the "third contact layer 136", respectively.

The upper electrode 140 includes an upper electrode 142 provided on the first contact layer 132, an upper electrode 144 provided on the second contact layer 134, and an upper electrode 146 provided on the third contact layer 136. The upper electrodes 142, 144 and 146 are formed by the same material in the same step. The upper electrodes 142, 144 and 146 are formed by a metal, for example, and specifically, the upper electrodes 142, 144 and 146 are formed by aluminum, tantalum, molybdenum or titanium, for example. The thickness of the upper electrode 140 is 1500 Å, for example. The upper electrode 142, the upper electrode 144 and the upper electrode 146 are arranged in order in the y direction. The interval between the upper electrode 142, the upper electrode 144 and the upper electrode 146 is 5 µm, for example. The upper electrode 144 is not directly connected to the upper electrode 142, and the upper electrode 146 is not directly connected to the upper electrode 144. Here, the upper electrode 142 is directly connected to the upper electrode 146. Note that in the following description, the upper electrode 142, the upper electrode 144 and the upper electrode 146 may be referred to as the "first upper electrode 142", the "second upper electrode 144" and the "third upper electrode 146", respectively.

A TFT 200 of an inverse-staggered structure is provided in the semiconductor device 100. The lower electrode 110 is a portion of a gate line 210, and the insulating layer 104 is a gate insulating layer. The upper electrode 142 and the upper electrode 146 are portions of a drain line 230, and the upper electrode 144 is a portion of a source line 220. Here, the source line 220 is straight, and a portion of the drain line 230 diverges into two branches. In the semiconductor device 100, a region of the semiconductor layer 120 that is between the upper electrode 142 and the upper electrode 144 and a region thereof that is between the upper electrode 144 and the upper electrode 146 serve as channel regions, and the channel width of the TFT 200 is relatively large. When a predetermined voltage is applied to the gate line 210, the voltage applied to the upper electrode 144 is supplied to the upper electrodes 142 and 146 via the channel region of the semiconductor layer 120.

In the semiconductor device 100, the second contact layer 134 includes a region 134a, and a region 134b separate from the region 134a. The interval between the region 134a and the region 134b of the second contact layer 134 is 4 to 5 µm, for example. The region 134a corresponds to a region where the semiconductor region 120a and the upper electrode 144 overlap with each other, and the region 134b corresponds to a region where the semiconductor region 120b and the upper electrode 144 overlap with each other. In the following description, the region 134a and the region 134b may be referred to as the "first region 134a" and the "second region 134b", respectively.

The first contact layer 132 and the first region 134a of the second contact layer 134 are provided on the semiconductor region 120a, and the second region 134b of the second contact layer 134 and the third contact layer 136 are provided on the semiconductor region 120b. The second contact layer 134 is divided at the same position as the semiconductor layer 120, and the insulating layer 104 is not covered by the semiconductor layer 120 or the contact layer 130 in this area. The second upper electrode 144 covers both the first region 134a of the contact layer 134 on the semiconductor region 120a and the second region 134b thereof on the semiconductor region 120b, and the upper electrode 144 is provided not only on the first region 134a and the second region 134b of the second contact layer 134 but also in the region between the first region 134a and the second region 134b of the second contact layer 134 and in the region between the first semiconductor region 120a and the second semiconductor region 120b of the semiconductor layer 120, with the second upper electrode 144 directly in contact with the semiconductor region 120a and the semiconductor region 120b.

The second upper electrode 144 includes a side region 144s opposing the first upper electrode 142, a side region 144t opposing the third upper electrode 146, and a center region 144u located between the side region 144s and the side region 144t, with the center region 144u directly in contact with the first semiconductor region 120a and the second semiconductor region 120b of the semiconductor layer 120. For example, the width of each of the side region 144s and the side region 144t is 3 µm, and the width of the center region 144u is 4 to 5 µm. In the semiconductor device 100, the center region 144u of the second upper electrode 144 is also directly in contact with the insulating layer 104, and the area over which the second upper electrode 144 and the semiconductor layer 120 contact each other is relatively large.

Here, before discussing the path along which heat generated in the semiconductor layer 120 is transmitted, the thermal conductivity of the semiconductor layer 120 and members located in the vicinity thereof in the semiconductor device 100 will be discussed. The thermal conductivity of the lower electrode 110 and the upper electrodes 142, 144 and 146 is higher than the thermal conductivity of the semiconductor layer 120 and the contact layers 132, 134 and 136, and the thermal conductivity of the insulating layer 104 is lower than the thermal conductivity of the semiconductor layer 120 and the contact layers 132, 134 and 136. For example, the lower electrode 110 and the upper electrodes 142, 144 and 146 are formed by a metal, the semiconductor layer 120 and the contact layers 132, 134 and 136 are formed by a silicon film, and the insulating layer 104 is formed by an insulating material. In this case, the thermal conductivity relation is as follows: metal>silicon>insulating material.

Therefore, heat generated due to the large current flowing through the semiconductor layer 120 is not only transmitted from the semiconductor layer 120 to the outside via the contact layers 132, 134 and 136 and the upper electrodes 142, 144 and 146, but also transmitted to the outside via the second upper electrode 144 which is directly in contact with the first semiconductor region 120a and the second semiconductor region 120b of the semiconductor layer 120. Since the thermal resistance is in proportion to the path length and in inverse proportion to the thermal conductivity and the cross section of the path, the thermal resistance is reduced in the semiconductor device 100 by shortening the path length by providing the second upper electrode 144 which has a high thermal conductivity near the channel region of the semiconductor layer 120. Therefore, in the semiconductor device 100, it is possible to suppress the deterioration of characteristics of the TFT 200 without changing the channel width. Since the second upper electrode 144 which has a high thermal conductivity is provided between the first region 134a and the second region 134b of the second contact layer 134 and between the first semiconductor region 120a and the second semiconductor region 120b of the semiconductor layer 120, the semiconductor device 100 can efficiently dissipate heat even if the interval between the first region 134a and the second region 134b of the second contact layer 134 and the interval between the first semiconductor region 120a and the second semiconductor region 120b of the semiconductor layer 120 are short.

The semiconductor device 100 is suitably used in an active matrix substrate of a display device, or the like. The TFT 200 of the semiconductor device 100 is suitably used as a circuit TFT provided in a gate driver and a source driver of an active matrix substrate, as a large ON current can be realized.

The semiconductor device 100 of the present embodiment is manufactured as follows.

First, the gate line 210 including the lower electrode 110 is formed on the insulating substrate 102. The gate line 210 is formed by depositing a conductive layer, and then patterning the conductive layer using a photoresist layer formed by using a photomask. Then, the insulating layer 104 covering the gate line 210 is formed.

Next, a semiconductor film is deposited on the insulating layer 104, and then a contact film is deposited on the semiconductor film. For example, the semiconductor film is a silicon film, and the contact film is a silicon film with an impurity element added thereto. Then, the semiconductor film and the contact film are patterned simultaneously. The patterning is done using a photoresist layer formed by using a photomask. Through this patterning, the semiconductor regions 120a and 120b and contact layers corresponding thereto are formed.

Next, a conductive layer is deposited on the insulating layer 104 and the contact layer, and then the deposited conductive layer is patterned so as to form the upper electrode 142, the upper electrode 144 and the upper electrode 146. Moreover, the contact layer is patterned using the upper electrode 142, the upper electrode 144 and the upper electrode 146 as a mask, thereby forming the contact layer 132, the contact layer 134 and the contact layer 136.

Next, an interlayer insulating film 106 covering the semiconductor layer 120 and the first, second and third upper electrodes 142, 144 and 146 is formed. Note that contact holes may be formed in the interlayer insulating film 106 as necessary. The semiconductor device 100 including the TFT 200 is produced as described above.

Note that with the semiconductor device 100 of the present embodiment, by changing the photomask for forming the photoresist layer for patterning the semiconductor film and the contact film, it is possible to separate the semiconductor region 120a and the semiconductor region 120b of the semiconductor layer 120 from each other, and a portion of the upper electrode 144 formed thereafter is provided in a region between the semiconductor region 120a and the semiconductor region 120b, resulting in the upper electrode 144 being directly in contact with the semiconductor region 120a and the semiconductor region 120b. Thus, the semiconductor device 100 can be easily produced by using existing apparatuses and facilities except for the change of the photomask.

Figure 2:
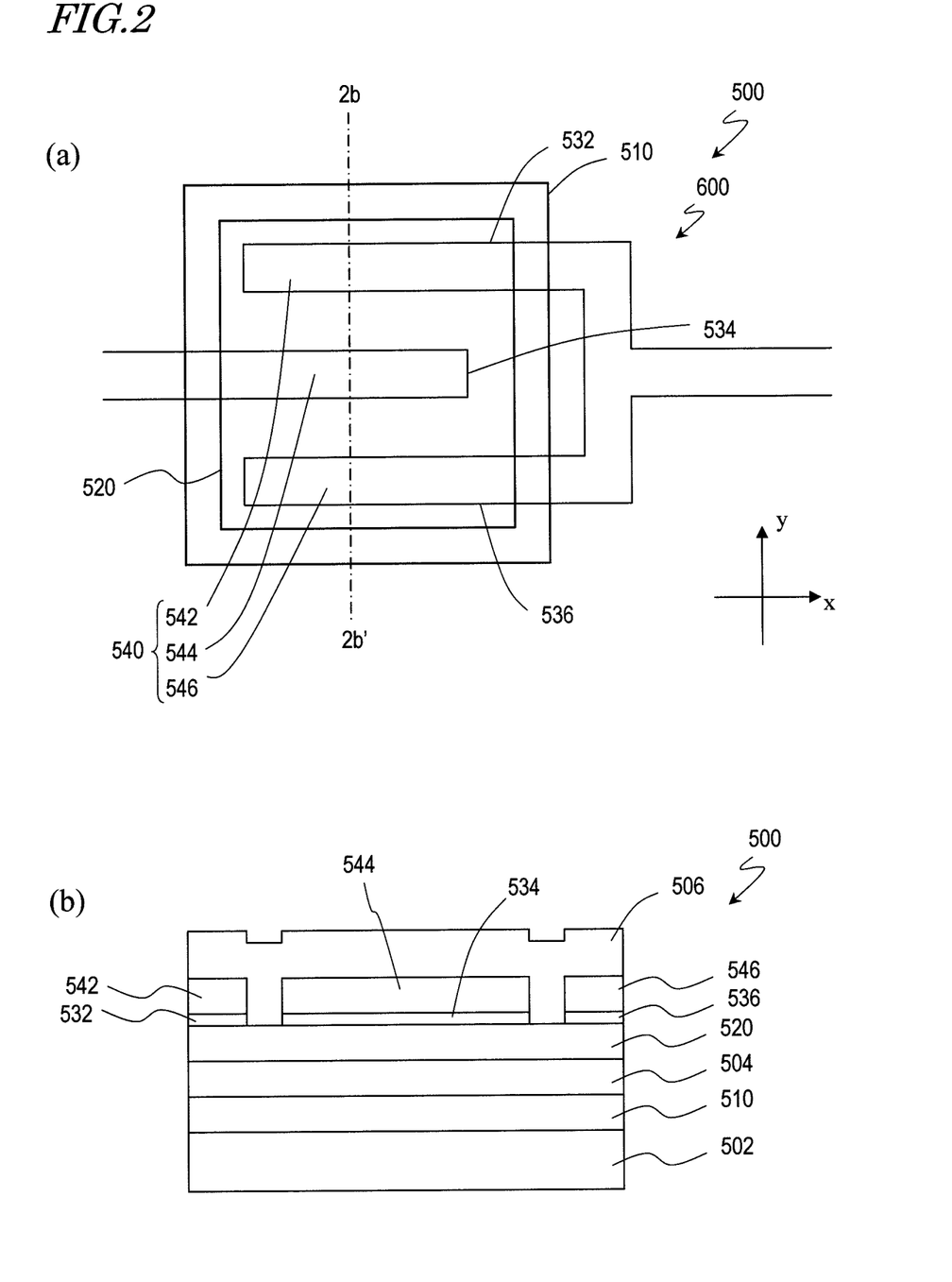
Figure 3:
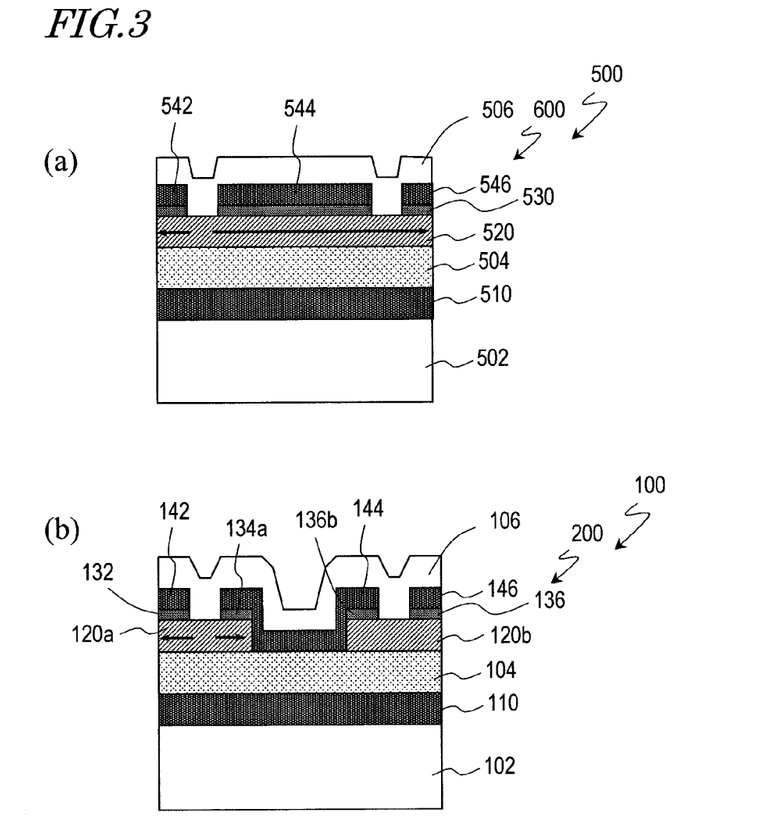

Referring to FIGS. 2 and 3, advantages of the semiconductor device of the present embodiment will now be described in comparison with a semiconductor device of Reference Example. First, referring to FIG. 2, a semiconductor device 500 of Reference Example will be described. FIG. 2(a) shows a schematic top view of the semiconductor device 500 of the present embodiment, and FIG. 2(b) shows a cross-sectional view taken along line 2b-2b' of FIG. 2(a).

In the semiconductor device 500, a semiconductor layer 520 is not divided into two regions, with contact layers 532, 534 and 536 provided on the semiconductor layer 520, and upper electrodes 542, 544 and 546 provided on the contact layers 532, 534 and 536.

Heat generated in the semiconductor layer 520 is transmitted to the upper electrodes 542, 544 and 546 via the contact layers 532, 534 and 536. Thus, in the semiconductor device 500 of Reference Example, a portion of the heat generated in the semiconductor layer 520 is transmitted in a direction perpendicular to the thickness direction of the silicon film. On the other hand, as the semiconductor layer 520 is viewed in a planar direction, the semiconductor layer 520 is surrounded by an interlayer insulating film 506, and heat transmitted in the planar direction is not sufficiently discharged, thereby increasing the temperature of the semiconductor layer 520.

FIG. 3(a) schematically shows the path of a portion, which is transmitted in the planar direction, of the heat generated in a region of the semiconductor layer 520 that corresponds to the portion between the upper electrode 542 and the upper electrode 544 in the semiconductor device 500 of Reference Example. In the semiconductor device 500, the path length of the heat dissipation path is relatively long. Note that as described above, the thermal resistance is in proportion to the path length of the heat dissipation path and in inverse proportion to the cross section of the path. Therefore, with the semiconductor device 500 of Reference Example, the thermal resistance increases, and the deterioration of the characteristics of the TFT 600 is likely to occur.

Figure 4:
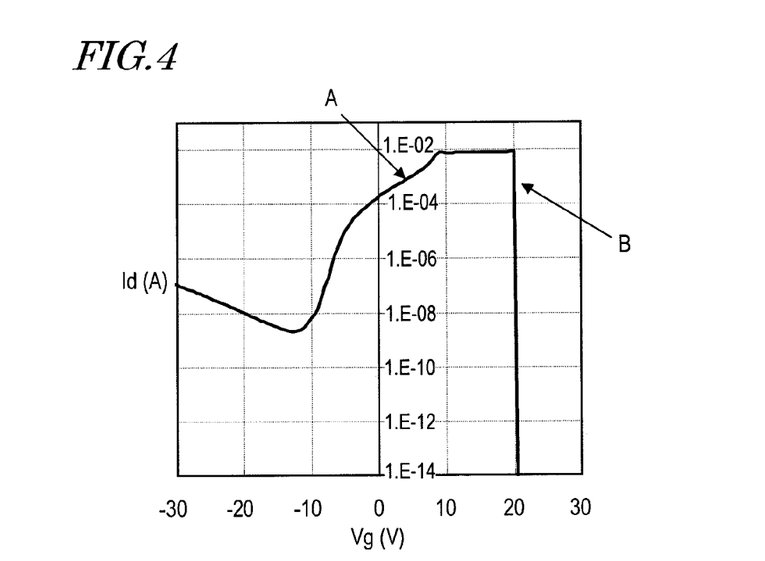
FIG. 4 A graph showing characteristics of a deteriorated thin film transistor.

FIG. 4 shows the results of the TFT 600 whose characteristics have deteriorated due to heat. With such a TFT 600, when a positive gate voltage is applied, the drain current is not saturated but continues to increase, as indicated by A in FIG. 4. When the degree of deterioration is significant, the TFT 600 is broken and the drain current is no longer output, as indicated by B in FIG. 4.

FIG. 3(b) schematically shows the path of a portion, which is transmitted in the planar direction, of the heat generated in a region of the semiconductor layer 120 that corresponds to the portion between the upper electrode 142 and the upper electrode 144 in the semiconductor device 100 of the present embodiment. In the semiconductor device 100, the semiconductor layer 120 is directly in contact with the upper electrode 144 which has a relatively high thermal conductivity. Therefore, in the semiconductor device 100, as compared with the semiconductor device 500, the heat dissipation path of the silicon film is short and the thermal resistance decreases. Therefore, the heat generated in the semiconductor layer 120 is easily transmitted to the outside via the semiconductor layer 120 and the upper electrode 144. Thus, with the semiconductor device 100, heat can be dissipated efficiently, thereby suppressing the deterioration of characteristics of the TFT 200. Note that as viewed from the reverse surface of the semiconductor device 100, the gate line 210 herein covers the semiconductor layer 120. Therefore, if a liquid crystal display device is produced using the semiconductor device 100, the gate line 210 reduces the light from the backlight entering the semiconductor device 100.

Note that while the first upper electrode 142 and the third upper electrode 146 are portions of the drain line 230 and the second upper electrode 144 is a portion of the source line 220 in the description above, the present invention is not limited thereto. The first upper electrode 142 and the third upper electrode 146 may be portions of the source line, and the second upper electrode 144 may be a portion of the drain line.

Embodiment 2

While the upper electrodes extend in parallel to each other in the description above, and the present invention is not limited thereto.

Figure 5:
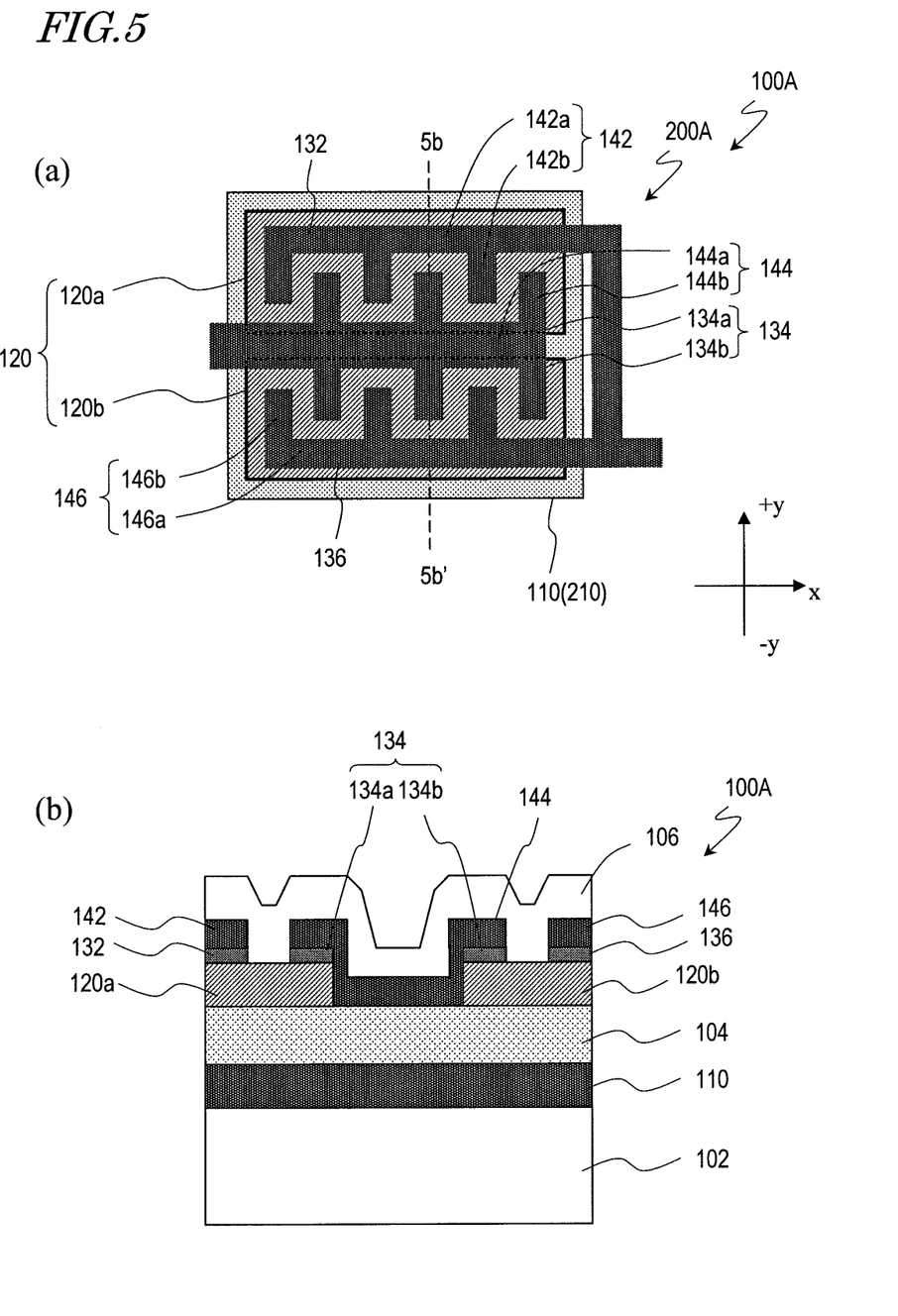

A second embodiment of the semiconductor device according to the present invention will now be described with reference to FIG. 5. FIG. 5(a) shows a schematic top view of a semiconductor device 100A of the present embodiment, and FIG. 5(b) shows a cross-sectional view taken along line 5b-5b' of FIG. 5(a). The semiconductor device 100A has a similar configuration to that of the semiconductor device 100 except that the upper electrode 140 is provided with branch portions, and will not be described repeatedly to avoid redundancy.

In the semiconductor device 100A, the upper electrode 140 includes the upper electrodes 142, 144 and 146. The upper electrode 144 is a portion of the source line 220. The upper electrode 142 and the upper electrode 146 are directly connected to each other, and the upper electrode 142 and the upper electrode 146 are portions of the drain line 230. A portion of the drain line 230 is in a "U"-letter shaped.

The first upper electrode 142 includes a branch portion 142a, and a branch portion 142b extending from the branch portion 142a to the second upper electrode 144. The third upper electrode 146 includes a branch portion 146a, and a branch portion 146b extending from the branch portion 146a to the second upper electrode 144. The second upper electrode 144 includes a branch portion 144a, and a branch portion 144b extending from the branch portion 144a to the first upper electrode 142 and the third upper electrode 146. The branch portion 144b extends from the branch portion 144a both in the +y direction and the −y direction. The branch portions 142b, 144b and 146b extend alternately with one another toward the branch portions 142a, 144a and 146a, and the shortest distance between the first upper electrode 142 and the second upper electrode 144 and the shortest distance between the second upper electrode 144 and the third upper electrode 146 are kept generally constant. Thus, a region of the semiconductor layer 120 that corresponds to the portion between the first upper electrode 142 and the second upper electrode 144 and a region thereof that corresponds to the portion between the second upper electrode 144 and the third upper electrode 146 serve as channel regions. Note that while a rectangular channel region is provided in the semiconductor device 100 described above, the channel region has a bent structure in the semiconductor device 100A of the present embodiment. Thus, with a TFT 200A, the channel width can be made relatively large, and a large ON current can be realized.

The contact layer 132 is provided on the semiconductor region 120a, and the upper electrode 142 is provided on the contact layer 132. Similarly, the contact layer 136 is provided on the semiconductor region 120b, and the upper electrode 146 is provided on the contact layer 136.

The contact layer 134 is provided on the semiconductor regions 120a and 120b. The region 134a of the contact layer 134 is separate from the region 134b, with the region 134a of the contact layer 134 provided on the semiconductor region 120a and the region 134b of the contact layer 134 provided on the semiconductor region 120b. The upper electrode 144 covers the region 134a and the region 134b of the contact layer 134, and the upper electrode 144 is also provided between the region 134a and the region 134b of the contact layer 134. Therefore, the upper electrode 144 is directly in contact with the semiconductor layer 120, and specifically, the upper electrode 144 is directly in contact with the semiconductor region 120a and the semiconductor region 120b. Therefore, the heat generated due to the large current flowing through the channel region of the semiconductor layer 120 is not only transmitted to the outside from the semiconductor layer 120 via the contact layers 132, 134 and 136 and the upper electrodes 142, 144 and 146, but also transmitted to the outside via the second upper electrode 144 which is directly in contact with the first semiconductor region 120a and the second semiconductor region 120b of the semiconductor layer 120. Therefore, in the semiconductor device 100A, the thermal resistance is reduced by shortening the path length, and heat can be dissipated efficiently. The semiconductor device 100A is suitably used in an active matrix substrate of a display device, or the like.

Embodiment 3

Figure 6:
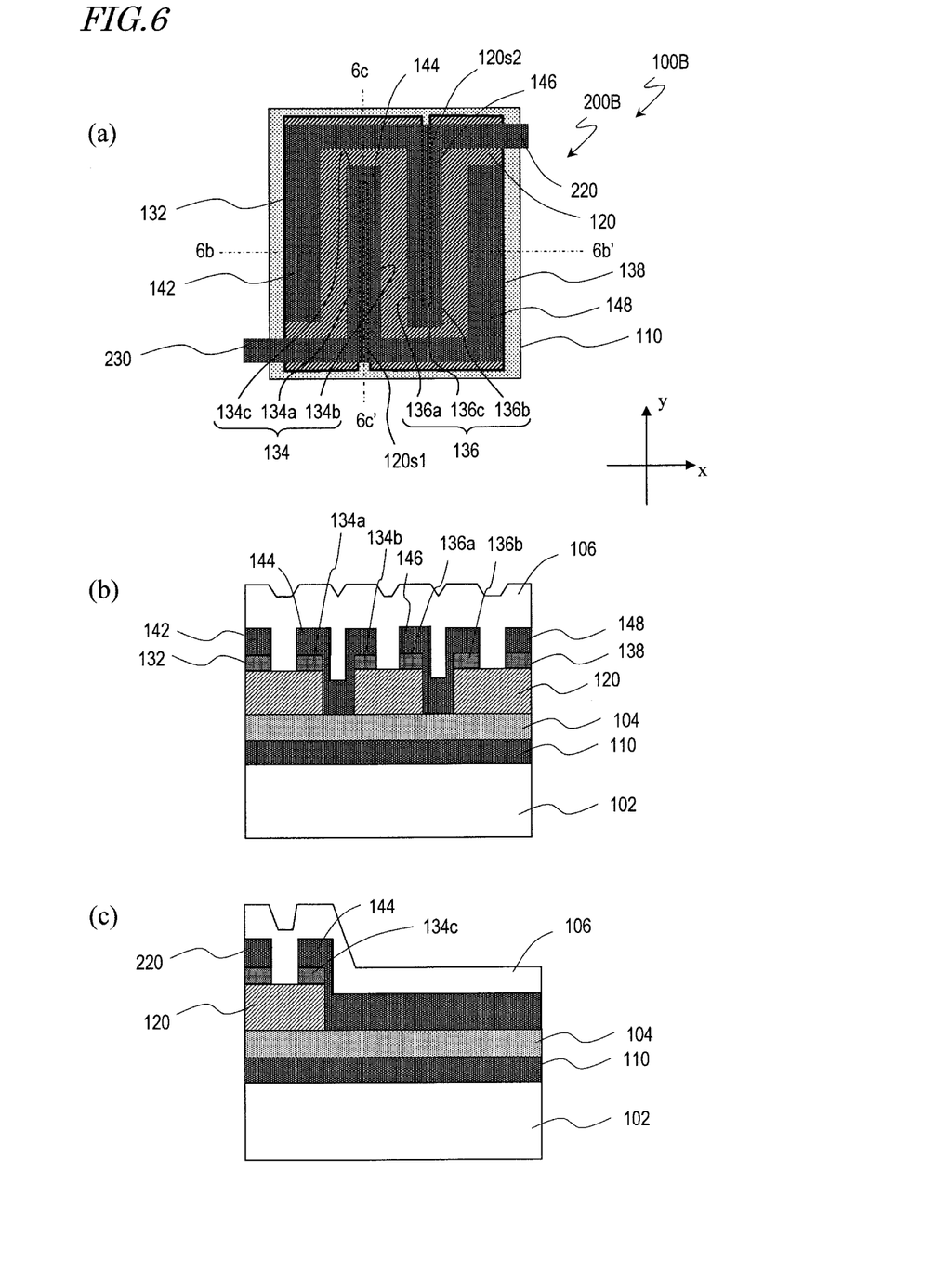

A third embodiment of the semiconductor device according to the present invention will now be described with reference to FIG. 6. FIG. 6(a) shows a schematic top view of a semiconductor device 100B of the present embodiment, FIG. 6(b) shows a cross-sectional view taken along line 6b-6b' of FIG. 6(a), and FIG. 6(c) shows a cross-sectional view taken along line 6c-6c' of FIG. 6(a). Note that the semiconductor device 100B has a similar configuration to that of the semiconductor device 100 except for the semiconductor layer 120, the contact layer 130 and the upper electrode 140, and will not be described redundantly in order to avoid redundancy.

Four upper electrodes 142, 144, 146 and 148 are provided in a TFT 200B of the semiconductor device 100B. Note that while the upper electrodes 142, 144 and 146 are arranged in the y direction in the semiconductor devices 100 and 100A described above, the upper electrodes 142, 144, 146 and 148 are arranged in this order in the x direction with a predetermined interval therebetween in the semiconductor device 100B. The upper electrodes 142 and 146 are portions of the source line 220, and the upper electrodes 144 and 148 are portions of the drain line 230. The source line 220 and the drain line 230 have comb-like shapes opposing each other.

In the semiconductor device 100B, slits 120s1 and 120s2 are provided in the semiconductor layer 120. The slit 120s1 is provided in an area of the semiconductor layer 120 that overlaps with the upper electrode 144, and the slit 120s2 is provided in an area of the semiconductor layer 120 that overlaps with the upper electrode 146. The slits 120s1 and 120s2 are formed by patterning together with the formation of the semiconductor layer 120.

In the semiconductor device 100B, the contact layer 130 includes contact layers 132, 134, 136 and 138. At least portions of the upper electrodes 142, 144, 146 and 148 are provided on the contact layers 132, 134, 136 and 138, respectively.

The contact layer 134 is divided corresponding to the slit 120s1 of the semiconductor layer 120. The contact layer 134 includes the region 134a, the region 134b separate from the region 134a, and a connecting region 134c connecting together the region 134a and the region 134b. The region 134a corresponds to a region of the semiconductor layer 120 that overlaps with the upper electrode 144 along one of the long sides with respect to the slit 120s1, the region 134b corresponds to a region of the semiconductor layer 120 that overlaps with the upper electrode 144 along the other one of the long sides with respect to the slit 120s1, and the connecting region 134c corresponds to a region of the semiconductor layer 120 that overlaps with the upper electrode 144 along a short side of the slit 120s1.

Similarly, the contact layer 136 includes a region 136a, a region 136b separate from the region 136a, and a connecting region 136c connecting together the region 136a and the region 136b. The region 136a corresponds to a region of the semiconductor layer 120 that overlaps with the upper electrode 146 along one of the long sides with respect to the slit 120s2, the region 136b corresponds to a region of the semiconductor layer 120 that overlaps with the upper electrode 146 along the other one of the long sides with respect to the slit 120s2, and the connecting region 136c corresponds to a region of the semiconductor layer 120 that overlaps with the upper electrode 146 along a short side of the slit 120s2. In areas corresponding to the slits 120s1 and 120s2, the insulating layer 104 is not covered by the semiconductor layer 120 or the contact layer 130. The upper electrode 144 is provided between the region 134a and the region 134b of the contact layer 134, and the upper electrode 144 is directly in contact with the semiconductor layer 120. Similarly, the upper electrode 146 is provided between the region 136a and the region 136b of the contact layer 136, and the upper electrode 146 is directly in contact with the semiconductor layer 120. Therefore, the heat generated due to the large current flowing through the channel region of the semiconductor layer 120 is not only transmitted to the outside from the semiconductor layer 120 via the contact layers 132, 134, 136 and 138 and the upper electrodes 142, 144, 146 and 148, but also transmitted to the outside via the second upper electrode 144 and the third upper electrode 146 which are directly in contact with the semiconductor layer 120. In the semiconductor device 100B, the thermal resistance is reduced by shortening the path length, and the semiconductor device 100B can efficiently dissipate heat. The semiconductor device 100B is suitably used in an active matrix substrate of a display device, or the like.

Embodiment 4

While the first upper electrode 142 is directly connected to the third upper electrode 146 in the description above, the present invention is not limited thereto. The first upper electrode 142 does not have to be directly connected to the third upper electrode 146.

Figure 7:
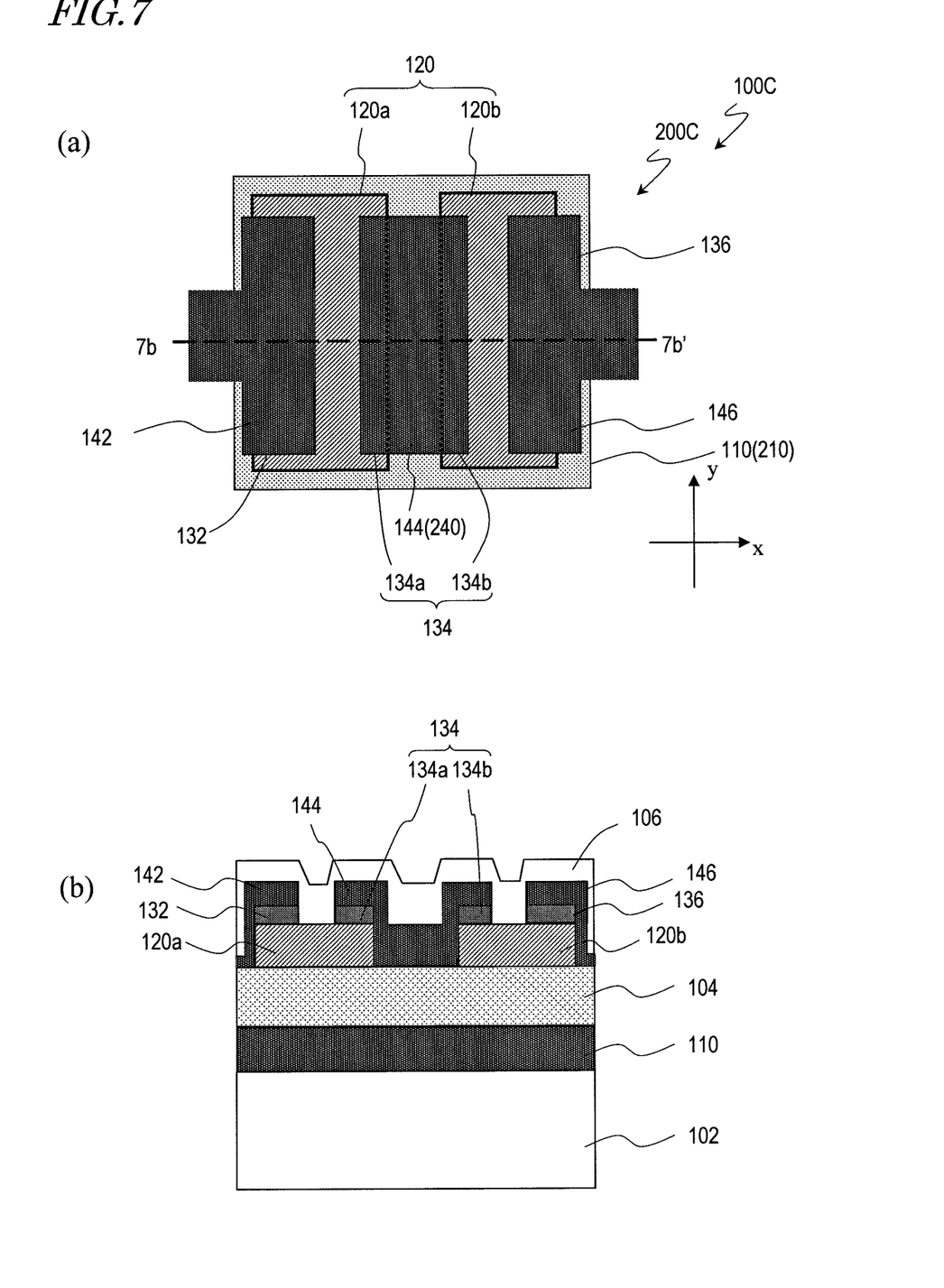

A fourth embodiment of the semiconductor device according to the present invention will now be described with reference to FIG. 7. FIG. 7(a) shows a schematic top view of a semiconductor device 100C of the present embodiment, and FIG. 7(b) shows a cross-sectional view taken along line 7b-7b' of FIG. 7(a). Note that what is redundant with the description above will not be described in order to avoid redundancy.

In the semiconductor device 100C, a TFT 200C has a double-gate structure, and the upper electrode 140 includes three upper electrodes 142, 144 and 146. The upper electrodes 142, 144 and 146 are arranged in this order in the x direction. In the semiconductor device 100C, the upper electrode 142 is a portion of the source line 220, and the upper electrode 146 is a portion of the drain line 230. When a predetermined voltage is applied to the gate line 210 in the semiconductor device 100C, the voltage applied to the source line 220 is supplied to the drain line 230 via an intermediate electrode 240. Therefore, the upper electrode 144 is also referred to as the "intermediate electrode 240".

The semiconductor layer 120 includes the semiconductor region 120a, and the semiconductor region 120b separate from the semiconductor region 120a. The contact layer 132 is provided on the semiconductor region 120a, and the upper electrode 142 is provided on the contact layer 132. Similarly, the contact layer 136 is provided on the semiconductor region 120b, and the upper electrode 146 is provided on the contact layer 136.

The contact layer 134 is provided on the semiconductor regions 120a and 120b. The region 134a of the contact layer 134 is separate from the region 134b, with the region 134a of the contact layer 134 provided on the semiconductor region 120a, and the region 134b of the contact layer 134 provided on the semiconductor region 120b. The upper electrode 144 covers the region 134a and the region 134b of the contact layer 134, and the upper electrode 144 is also provided between the region 134a and the region 134b of the contact layer 134. Therefore, the upper electrode 144 is directly in contact with the first semiconductor region 120a and the second semiconductor region 120b of the semiconductor layer 120.

In the semiconductor device 100C, the heat generated due to the large current flowing through the channel region of the semiconductor layer 120 is not only transmitted to the outside from the semiconductor layer 120 via the contact layers 132, 134 and 136 and the upper electrodes 142, 144 and 146, but also transmitted to the outside via the second upper electrode 144 which is directly in contact with the first semiconductor region 120a and the second semiconductor region 120b of the semiconductor layer 120. Therefore, in the semiconductor device 100C, the thermal resistance is reduced by shortening the path length, and heat can be dissipated efficiently. The semiconductor device 100C described above is suitably used in an active matrix substrate of a display device, or the like.

Note that while the TFT 200C described above has a dual-gate structure, the present invention is not limited thereto. The TFT 200C may have a triple-gate structure, or the TFT 200C may have another multi-gate structure.

Embodiment 5

While the semiconductor layer 120 is electrically connected to the upper electrode 140 via the contact layer 130 in the description above, the present invention is not limited thereto. The semiconductor layer may be electrically connected to the upper electrode without the contact layer therebetween.

Figure 8:
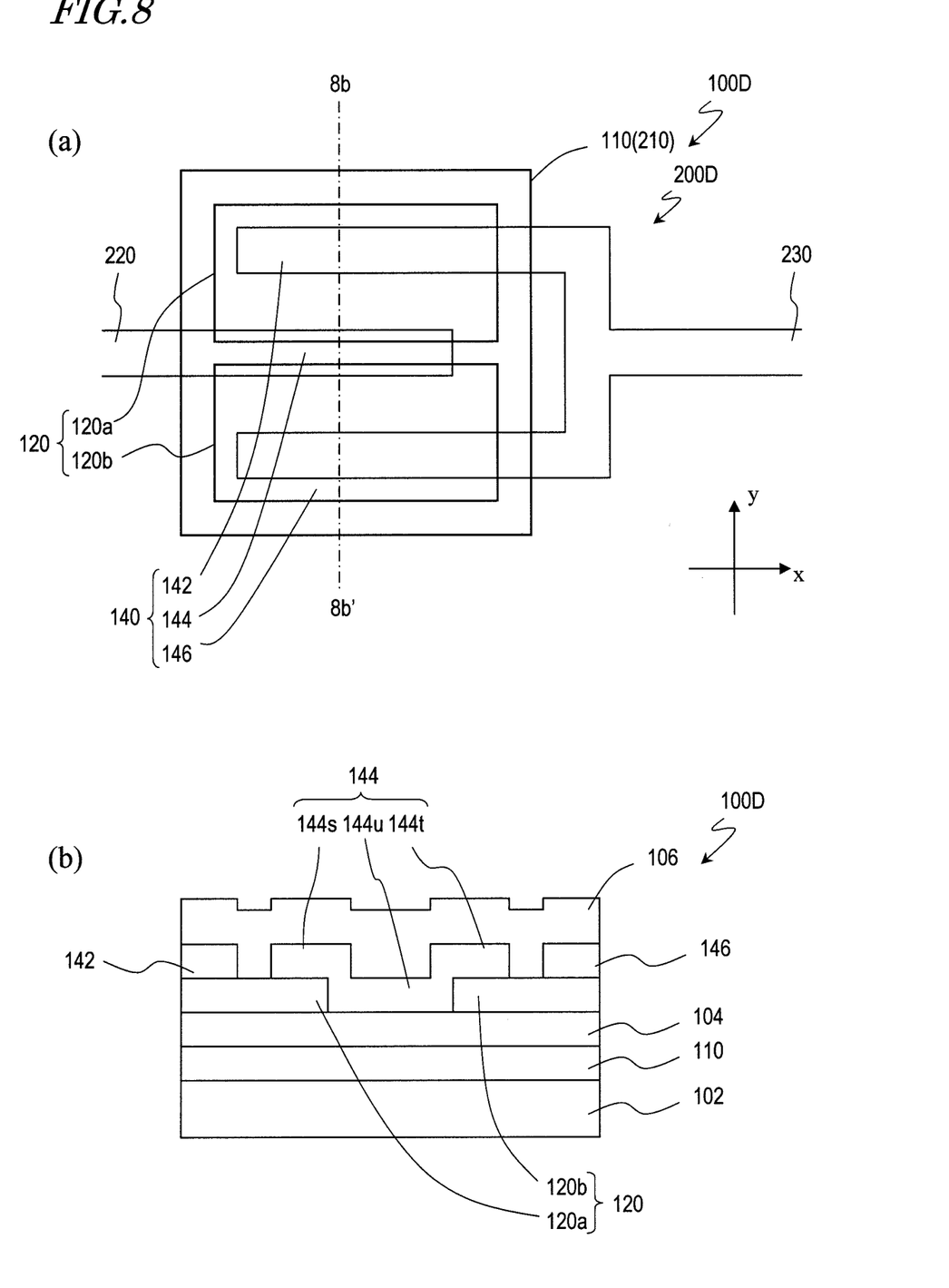

A fifth embodiment of the semiconductor device according to the present invention will now be described with reference to FIG. 8. FIG. 8(a) shows a schematic top view of a semiconductor device 100D of the present embodiment, and FIG. 8(b) shows a cross-sectional view taken along line 8b-8b' of FIG. 8(a). Note that what is redundant with the description above will not be described in order to avoid redundancy.

In the semiconductor device 100D, the upper electrode 140 includes three upper electrodes 142, 144 and 146. The upper electrodes 142, 144 and 146 are arranged in this order in the y direction. In the semiconductor device 100D, the upper electrode 144 is a portion of the source line 220, and the upper electrodes 142 and 146 are portions of the drain line 230. In the semiconductor device 100D, when a predetermined voltage is applied to the gate line 210, the voltage applied to the upper electrode 144 is supplied to the upper electrodes 142 and 146 via the channel region of the semiconductor layer 120.

The semiconductor layer 120 is formed by a silicon, for example, and specifically is formed by a polycrystalline silicon film. Alternatively, the semiconductor layer 120 may be formed by an oxide semiconductor. An impurity element is introduced into a region of the semiconductor layer 120 that overlaps with the upper electrode 140. The semiconductor layer 120 includes the semiconductor region 120a, and the semiconductor region 120b separate from the semiconductor region 120a.

The upper electrode 142 is provided on the semiconductor region 120a, and the upper electrode 146 is provided on the semiconductor region 120b. The upper electrode 144 covers a region of the semiconductor layer 120 between the first semiconductor region 120a and the second semiconductor region 120b, and at least a portion of the upper electrode 144 is also provided between the first semiconductor region 120a and the second semiconductor region 120b of the semiconductor layer 120.

In the semiconductor device 100D, the heat generated due to the large current flowing through the channel region of the semiconductor layer 120 is not only transmitted in the thickness direction of the semiconductor layer 120 so as to be transmitted to the outside from the semiconductor layer 120 via the upper electrodes 142, 144 and 146, but also transmitted in the planar direction of the semiconductor layer 120 so as to be transmitted to the outside via the second upper electrode 144 which is directly in contact with the first semiconductor region 120a and the second semiconductor region 120b of the semiconductor layer 120. Therefore, in the semiconductor device 100D, the deterioration of characteristics of a TFT 200D due to heat can be suppressed by forming a further heat dissipation path. The semiconductor device 100D described above is suitably used in an active matrix substrate of a display device, or the like.

While the upper electrodes 142 and 146 are portions of the drain line 230 and the upper electrode 144 is a portion of the source line 220 in the semiconductor device 100D in the description above, the present invention is not limited thereto. The upper electrodes 142 and 146 may be portions of the source line, and the upper electrode 144 may be a portion of the drain line. Alternatively, the upper electrode 142 may be a portion of the source line, the upper electrode 146 may be a portion of the drain line, and the upper electrode 144 may be an intermediate electrode.

Note that the disclosure of Japanese Patent Application No. 2009-23776, which is a basic application of the present application, is herein incorporated by reference.

INDUSTRIAL APPLICABILITY

By using the semiconductor device of the present invention, a monolithic substrate driver is suitably produced. The semiconductor device of the present invention is also suitably used in an active matrix substrate for organic EL.

REFERENCE SIGNS LIST

100 Semiconductor device
110 Lower electrode
120 Semiconductor layer
120a First semiconductor region
120b Second semiconductor region
130 Contact layer
132 First contact layer
134 Second contact layer
134a First region
134b Second region
136 Third contact layer
140 Upper electrode
142 First upper electrode
144 Second upper electrode
146 Third upper electrode
200 TFT

The invention claimed is:

1. A semiconductor device, comprising:
a lower electrode;
an insulating layer covering the lower electrode;
a semiconductor layer provided on the insulating layer;
a contact layer including a first contact layer, a second contact layer and a third contact layer each having at least a portion thereof overlapping with the semiconductor layer; and
an upper electrode including a first upper electrode at least a part of which overlaps with the first contact layer, a second upper electrode at least a part of which overlaps with the second contact layer, and a third upper electrode at least a part of which overlaps with the third contact layer, with the second upper electrode located between the first upper electrode and the third upper electrode; wherein
the second contact layer includes a first region, and a second region separate from the first region;
the second upper electrode is directly in contact with the semiconductor layer in a region between the first region and the second region of the second contact layer;
the first upper electrode and the third upper electrode are directly physically connected to each other;
the semiconductor layer includes a slit; and
the second contact layer is divided into the first region and the second region by the slit of the semiconductor layer.

2. The semiconductor device according to claim 1, wherein a thermal conductivity of the second upper electrode is higher than a thermal conductivity of the contact layer.

3. The semiconductor device according to claim 1, wherein the semiconductor layer includes a microcrystalline silicon film or an amorphous silicon film.

4. The semiconductor device according to claim 1, wherein the contact layer includes a silicon layer into which an impurity element is introduced.

5. The semiconductor device according to claim 1, wherein
the second upper electrode includes a first side region opposing the first upper electrode, a second side region opposing the third upper electrode, and a center region located between the first side region and the second side region; and
the center region of the second upper electrode is directly in contact with the semiconductor layer.

6. The semiconductor device according to claim 1, wherein the second upper electrode is in contact with the insulating layer.

7. The semiconductor device according to claim 1, wherein
the first upper electrode and the third upper electrode are portions of one of a source line and a drain line; and
the second upper electrode is a portion of the other one of the source line and the drain line.

8. A semiconductor device, comprising:
a lower electrode;

an insulating layer covering the lower electrode;
a semiconductor layer provided on the insulating layer;
a contact layer including a first contact layer, a second contact layer and a third contact layer each having at least a portion thereof overlapping with the semiconductor layer; and
an upper electrode including a first upper electrode at least a part of which overlaps with the first contact layer, a second upper electrode at least a part of which overlaps with the second contact layer, and a third upper electrode at least a part of which overlaps with the third contact layer, with the second upper electrode located between the first upper electrode and the third upper electrode; wherein
the second contact layer includes a first region, and a second region separate from the first region;
the second upper electrode is directly in contact with the semiconductor layer in a region between the first region and the second region of the second contact layer;
the first upper electrode and the third upper electrode are directly physically connected to each other;
the second upper electrode includes a trunk portion, a first branch portion extending from the trunk portion towards the first upper electrode, and a second branch portion extending from the trunk portion towards the third upper electrode; and
the trunk portion is directly in contact with the semiconductor layer in the region between the first region and the second region of the second contact layer.

9. The semiconductor device according to claim 8, wherein
the semiconductor layer includes a first semiconductor region, and a second semiconductor region separate from the first semiconductor region; and
at least a portion of the second upper electrode is provided in a region between the first semiconductor region and the second semiconductor region.

10. The semiconductor device according to claim 9, wherein a portion of the first contact layer and a portion of the second contact layer overlap with the first semiconductor region, and another portion of the second contact layer and the third contact layer overlap with the second semiconductor region.

11. The semiconductor device according to claim 8, wherein a thermal conductivity of the second upper electrode is higher than a thermal conductivity of the contact layer.

12. The semiconductor device according to claim 8, wherein the semiconductor layer includes a microcrystalline silicon film or an amorphous silicon film.

13. The semiconductor device according to claim 8, wherein the contact layer includes a silicon layer into which an impurity element is introduced.

14. The semiconductor device according to claim 8, wherein
the second upper electrode includes a first side region opposing the first upper electrode, a second side region opposing the third upper electrode, and a center region located between the first side region and the second side region; and
the center region of the second upper electrode is directly in contact with the semiconductor layer.

15. The semiconductor device according to claim 8, wherein the second upper electrode is in contact with the insulating layer.

16. The semiconductor device according to claim 8, wherein
the first upper electrode and the third upper electrode are portions of one of a source line and a drain line; and
the second upper electrode is a portion of the other one of the source line and the drain line.

* * * * *